United States Patent
Teraguchi et al.

(10) Patent No.: US 11,777,492 B2
(45) Date of Patent: Oct. 3, 2023

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Takayuki Teraguchi, Kawasaki Kanagawa (JP); Yosuke Ogasawara, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 17/940,561

(22) Filed: Sep. 8, 2022

(65) Prior Publication Data

US 2023/0170895 A1  Jun. 1, 2023

(30) Foreign Application Priority Data

Nov. 29, 2021 (JP) ................................. 2021-193163

(51) Int. Cl.
*H03K 17/56* (2006.01)
(52) U.S. Cl.
CPC .................................... *H03K 17/56* (2013.01)
(58) Field of Classification Search
CPC ................... H03F 3/72; H03K 17/102; H03K 2217/0018; H03K 17/693
See application file for complete search history.

(56) References Cited

U.S. PATENT DOCUMENTS

| | | | |
|---|---|---|---|
| 9,209,801 B2 | 12/2015 | Matsuno | |
| 10,715,133 B1* | 7/2020 | Scott | ................... H03K 17/161 |
| 10,998,900 B2 | 5/2021 | Scott et al. | |
| 2010/0225377 A1 | 9/2010 | Okashita | |
| 2021/0391858 A1* | 12/2021 | Shapiro | ................ H03K 17/693 |

FOREIGN PATENT DOCUMENTS

| | | | |
|---|---|---|---|
| CN | 115395936 A | * | 11/2022 |
| JP | 2010-212801 A | | 9/2010 |
| JP | 2010-278110 A | | 12/2010 |
| JP | 5996378 B2 | | 9/2016 |

* cited by examiner

*Primary Examiner* — Quan Tra
(74) *Attorney, Agent, or Firm* — Kim & Stewart LLP

(57) ABSTRACT

According to one embodiment, a semiconductor device includes a first transistor and a second transistor. The first transistor includes a first end, a second end, and a first body. The second transistor includes a third end coupled to the second end, a fourth end, and a second body. The semiconductor device includes a first resistor coupled to the first end, a second resistor coupled between the first resistor and the second end, a third resistor coupled to the third end, a fourth resistor coupled between the third resistor and the fourth end, a first diode coupled between the first body and a node coupling the third resistor and the fourth resistor, and a second diode coupled between the second body and a node coupling the first resistor and the second resistor.

15 Claims, 11 Drawing Sheets

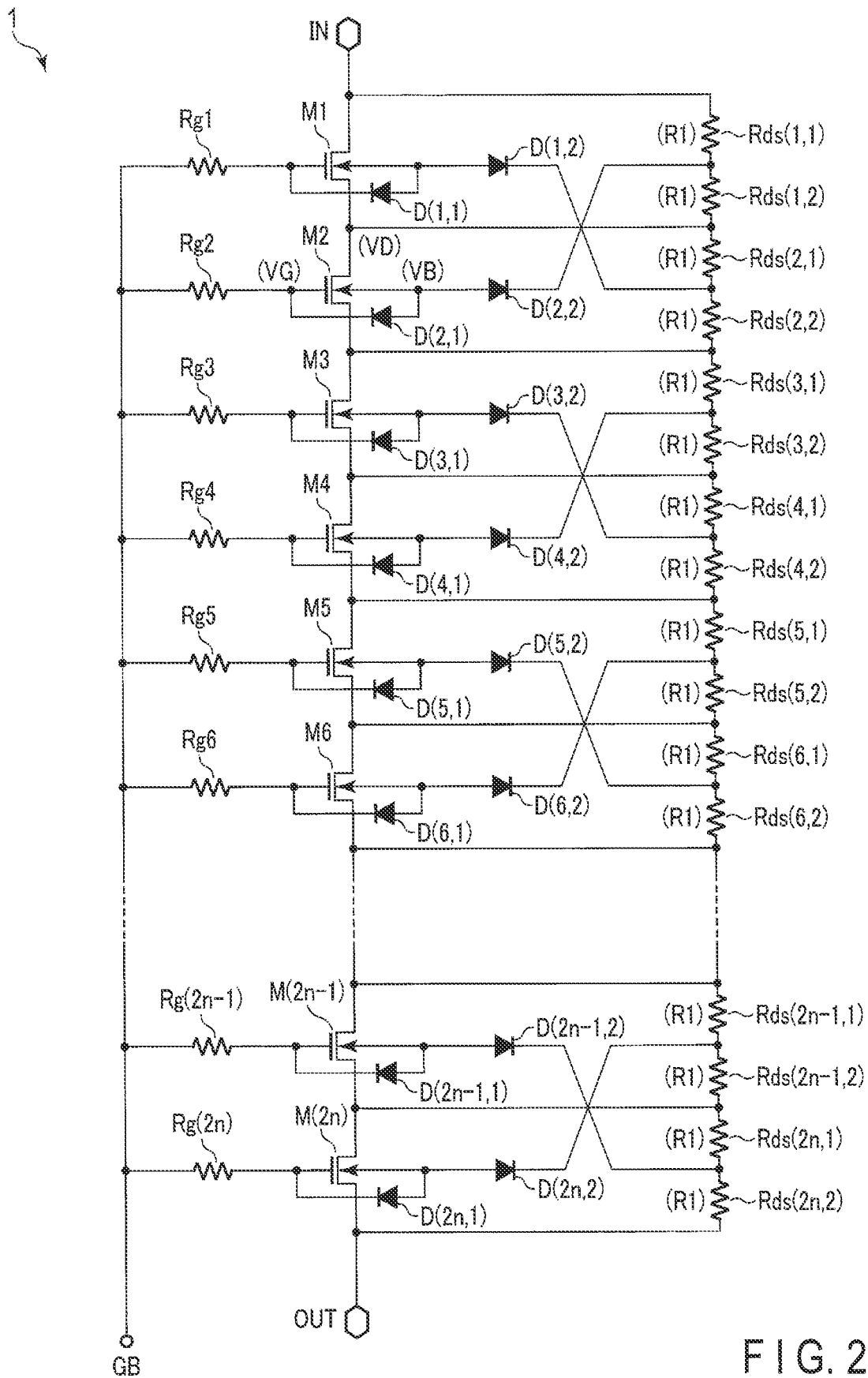
F I G. 2

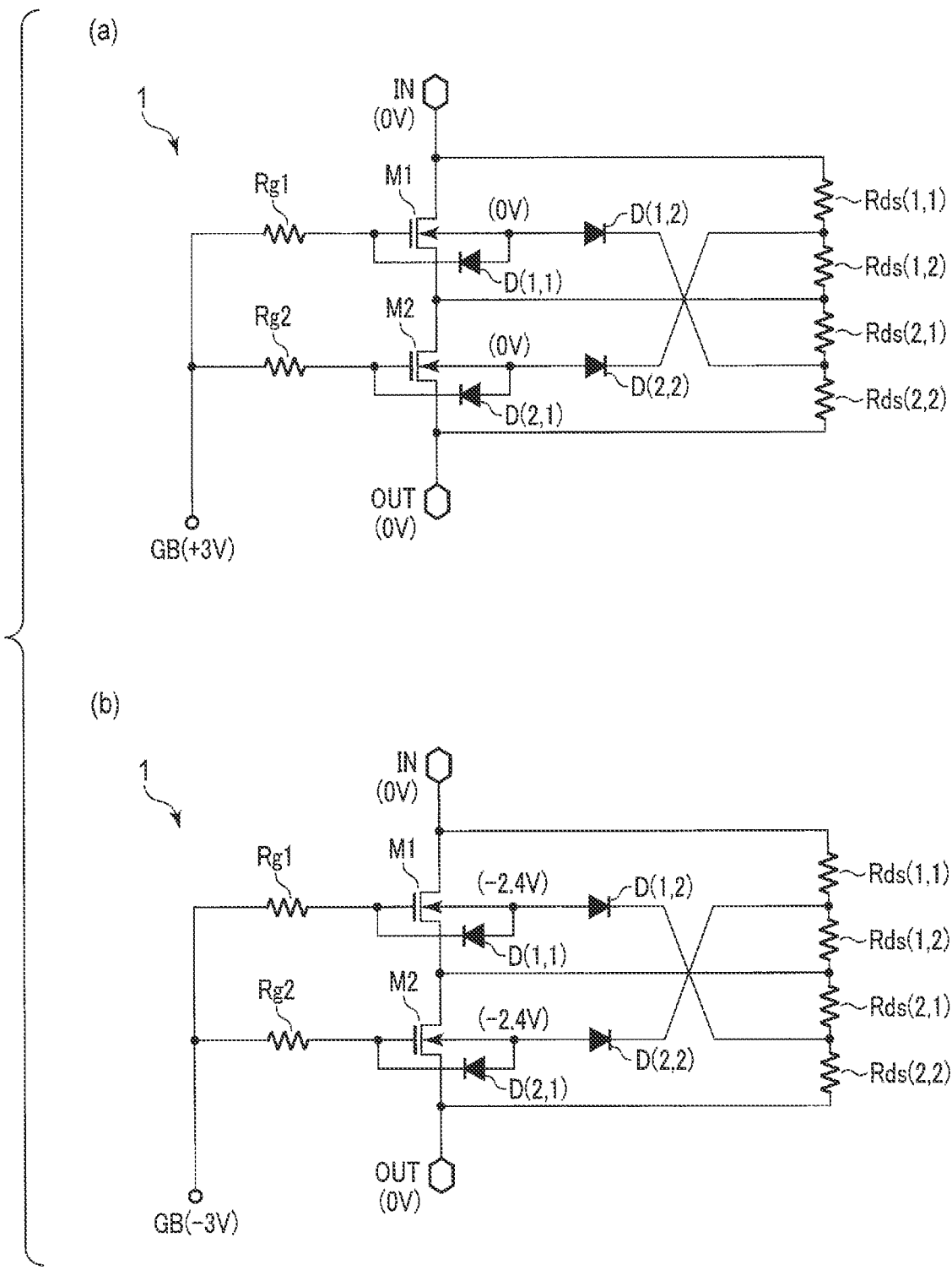
F I G. 4

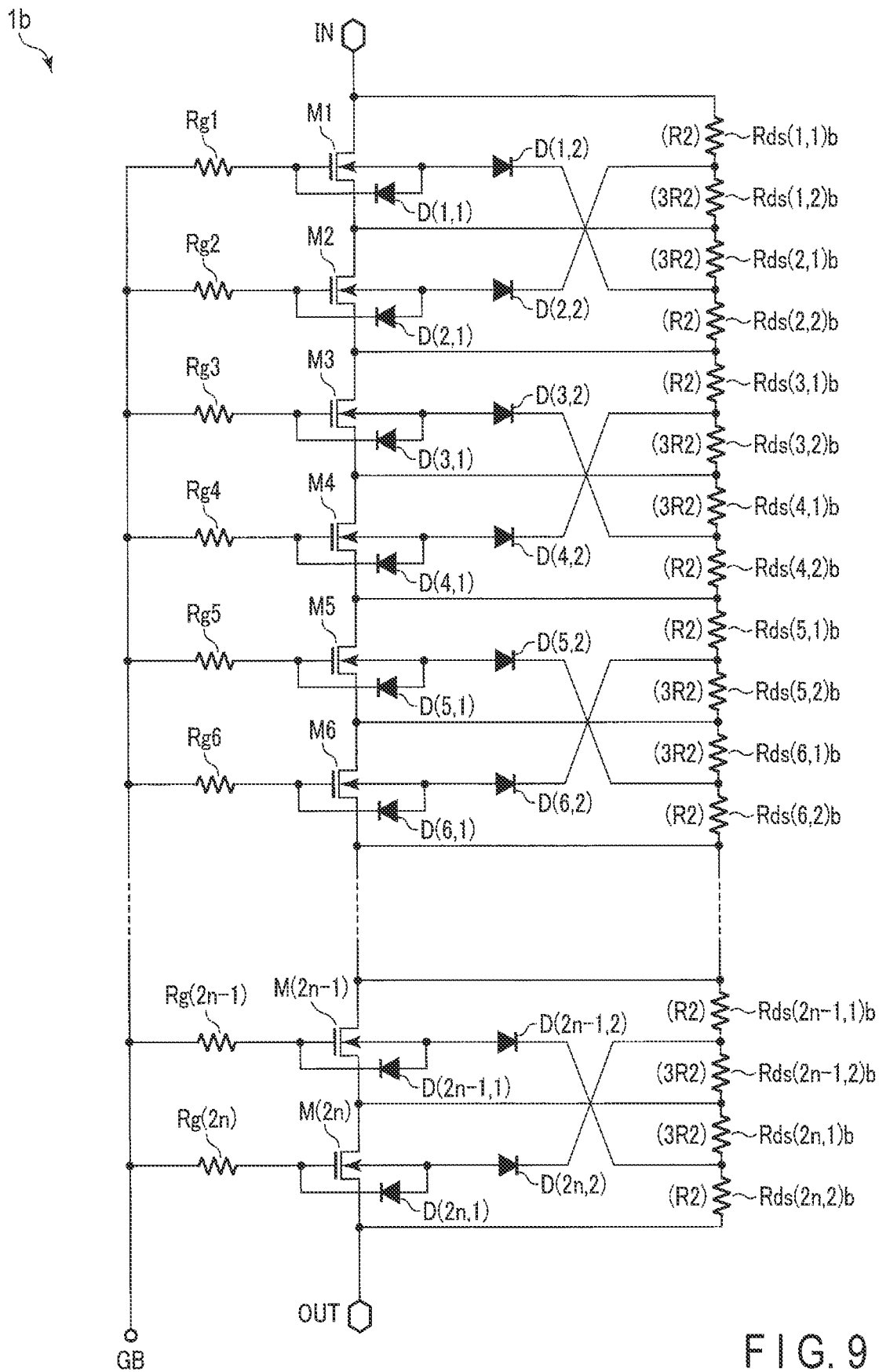
F I G. 9

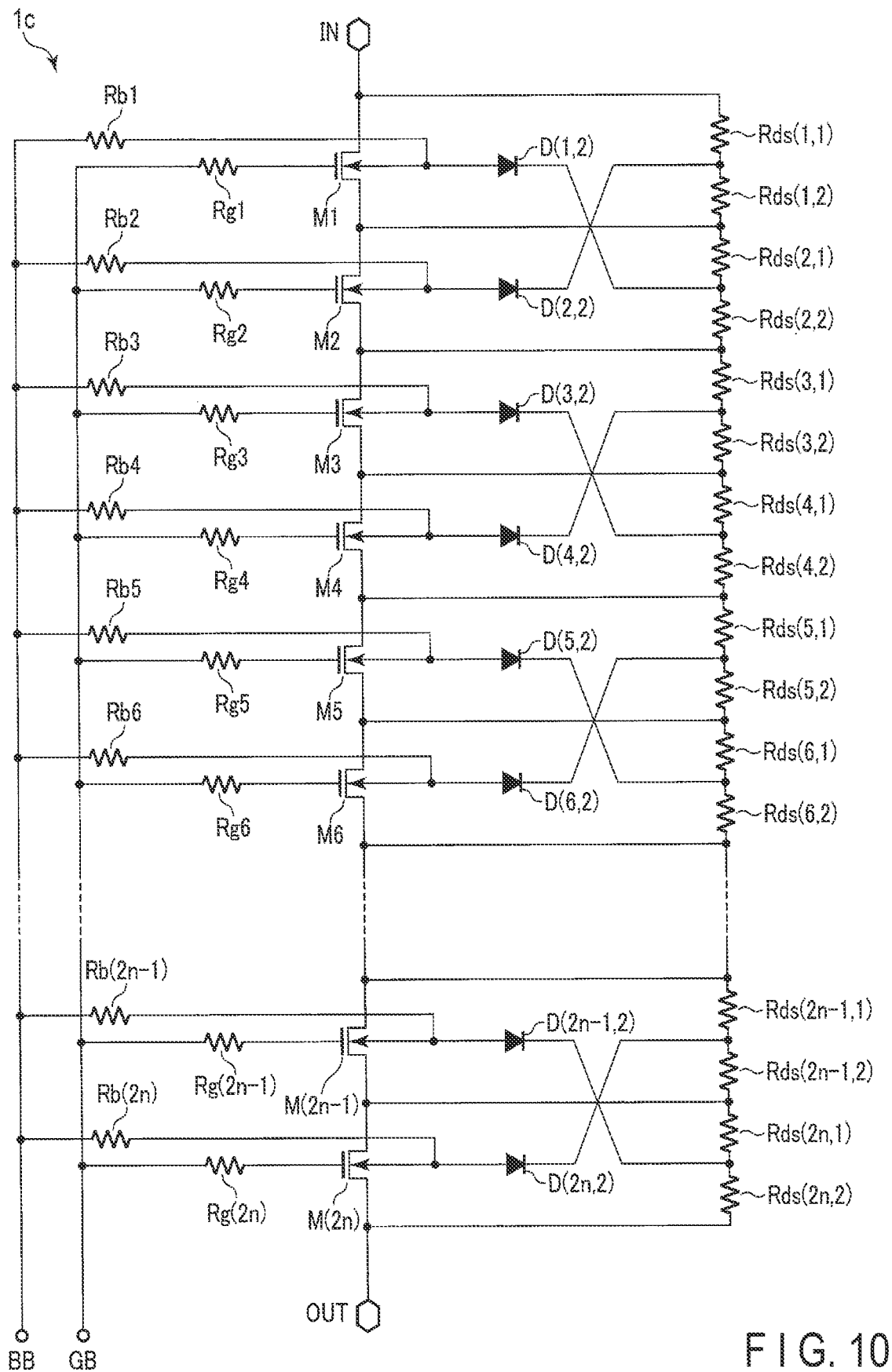
F I G. 10

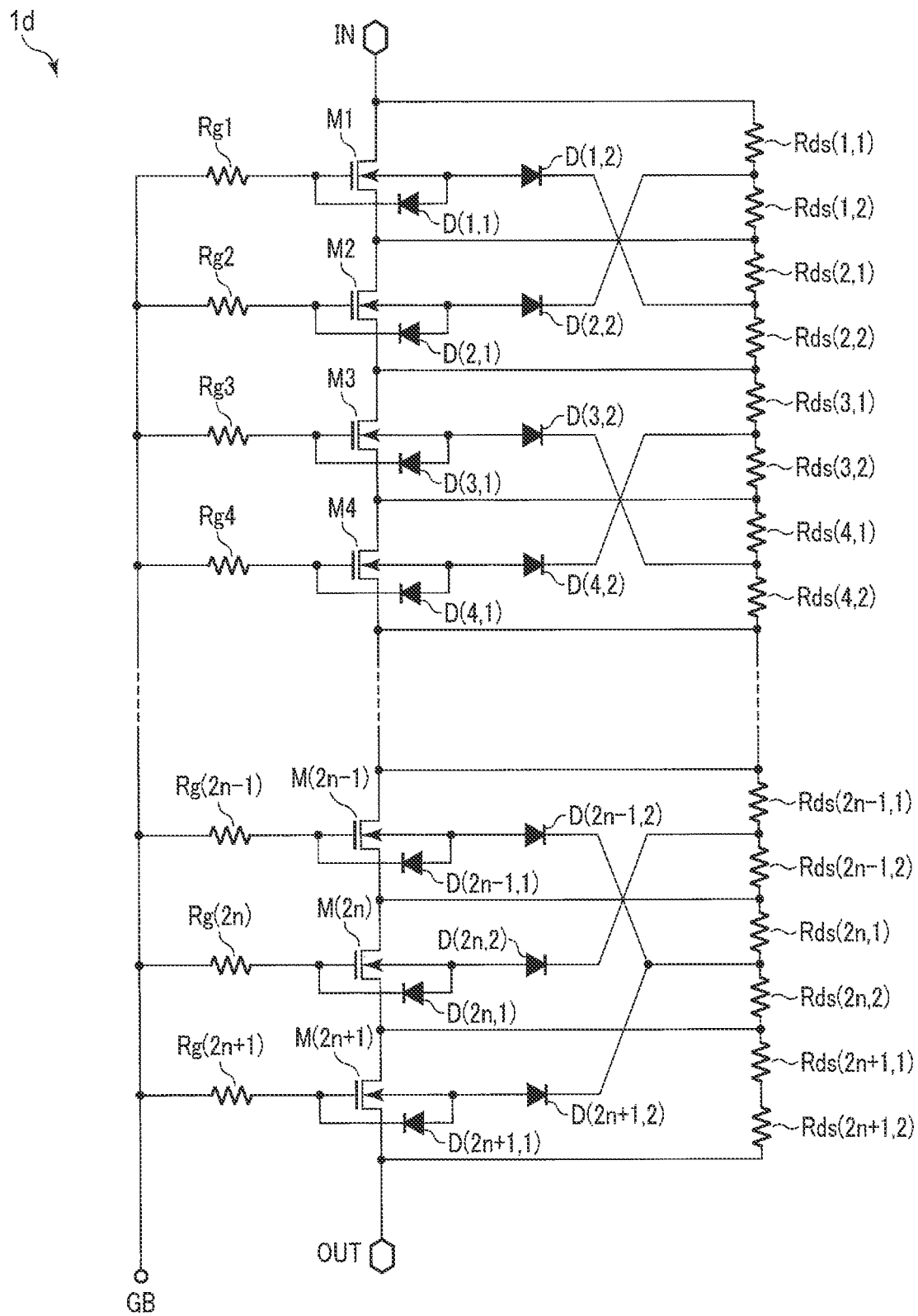
F I G. 11

SEMICONDUCTOR DEVICE

CROSS-REFERENCE TO RELATED APPLICATIONS

This application is based upon and claims the benefit of priority from Japanese Patent Application No. 2021-193163, filed Nov. 29, 2021, the entire contents of which are incorporated herein by reference.

FIELD

Embodiments described herein relate generally to a semiconductor device.

BACKGROUND

Switch circuits used for a portable terminal and the like have been known.

BRIEF DESCRIPTION OF THE DRAWINGS

FIG. 2 is a diagram for showing an exemplary circuitry configuration of a switch circuit of the first embodiment.

FIG. 4 is a diagram for explaining various bias voltages used in the switch circuit of the first embodiment.

FIG. 9 is a diagram for showing an exemplary circuitry configuration of a switch circuit of the third embodiment.

FIG. 10 is a diagram for showing an exemplary circuitry configuration of a switch circuit of the fourth embodiment.

FIG. 11 is a diagram for showing an exemplary circuitry configuration of a switch circuit of the fifth embodiment.

DETAILED DESCRIPTION

Figure 1:
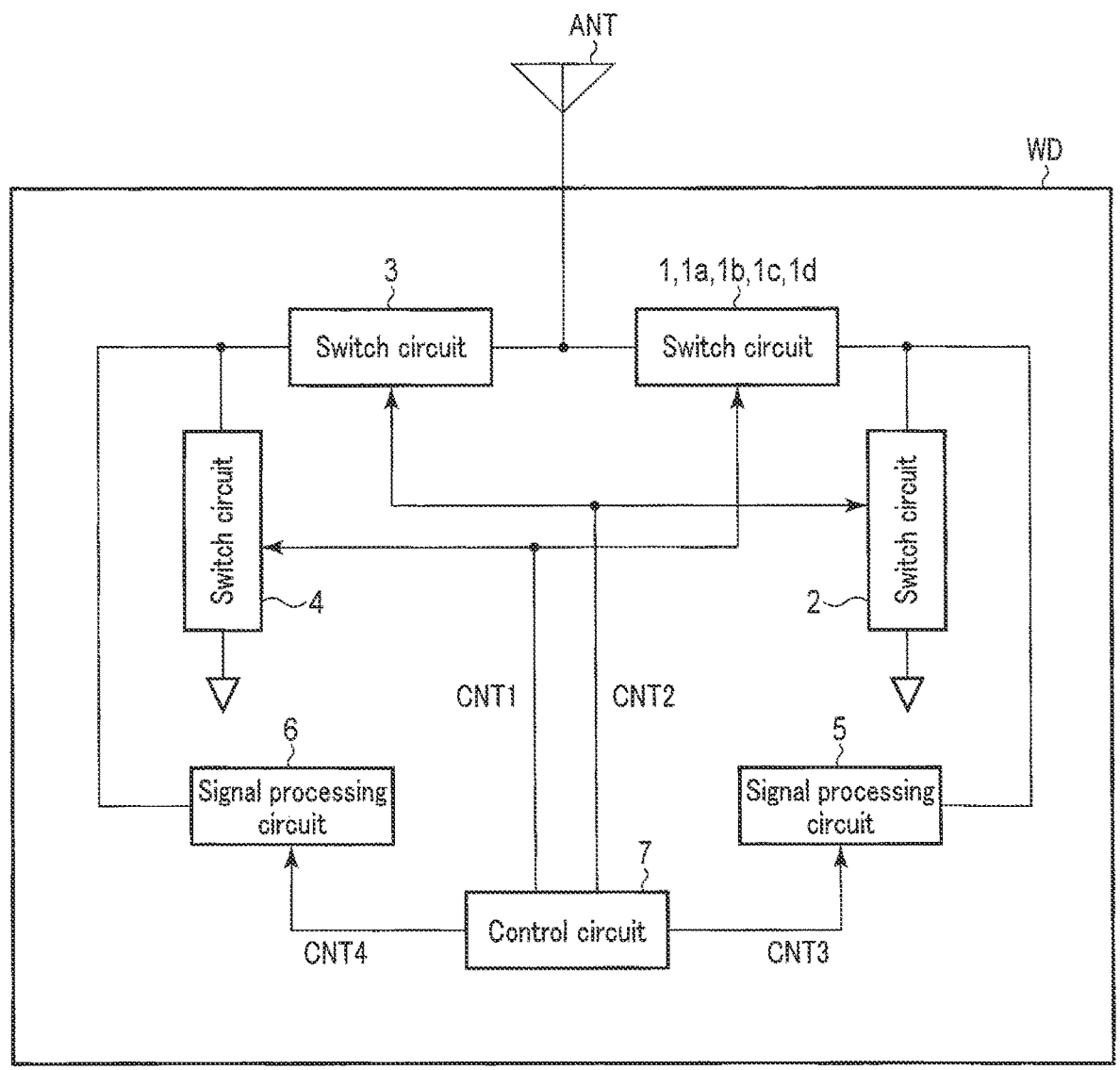
FIG. 1 is a block diagram for showing an exemplary configuration of a wireless device including switch circuits of the first embodiment.

In general, according to one embodiment, a semiconductor device includes an input terminal, an output terminal, and a first control terminal; a first transistor and a second transistor serially coupled between the input terminal and the output terminal, wherein the first transistor includes a first end and a second end used for the serial coupling, a first gate coupled to the first control terminal, and a first body; the second transistor includes a third end and a fourth end used for the serial coupling, a second gate coupled to the first control terminal, and a second body; and the third end is coupled to the second end; a first resistor coupled to the first end; a second resistor coupled between the first resistor and the second end; a third resistor coupled to the third end; a fourth resistor coupled between the third resistor and the fourth end; a first diode having an anode coupled to the first body and a cathode coupled to a node coupling the third resistor and the fourth resistor; and a second diode having an anode coupled to the second body and a cathode coupled to a node coupling the first resistor and the second resistor.

The embodiments will be explained below with reference to the drawings. In the following description, the same reference numerals are assigned to structural components having the same functions and structures. When structural components with the same reference numerals need to be distinguished from one another, indices may be attached to the numerals. When the structural components do not need to be particularly distinguished, the components will be given the reference numerals only, without any index.

Each of the functional blocks can be realized by hardware or software, or a combination of the two. The functional blocks do not necessarily need to be distinguished from one another as described below. For instance, part of the function may be implemented by a functional block that differs from the exemplified functional block. An exemplified functional block may be further divided into functional sub-blocks. The functional blocks and structural components described below are named as-is for the sake of convenience, and the names do not restrict the structures or operations or the functional blocks and structural components.

First Embodiment

A semiconductor device of the first embodiment will be described below. Hereinafter, the semiconductor device may also be referred to as a switch circuit 1.

(Exemplary Configuration)
(1) Wireless Device

FIG. 1 is a block diagram for showing an exemplary configuration of a wireless device WD including the switch circuit 1 of the first embodiment. The wireless device WD may be a smartphone, a feature phone, a portable terminal (e.g., tablet terminal), a personal computer, a game machine, a router, or a base station. The wireless device WD transmits and receives signals using communication standards such as Long-Term Evolution (LTE (trademark)) and/or Wifi. The reference numerals 1a, 1b, 1c, and 1d in FIG. 1 will be described in the subsequent embodiments.

The wireless device WD may include, in addition to the switch circuit 1, an antenna ANT, switch circuits 2, 3, and 4, signal processing circuits 5 and 6, and a control circuit 7.

The antenna ANT receives high-frequency signals from other devices (e.g., a base station or other wireless devices). The antenna ANT also transmits high-frequency signals from the wireless device WD to other devices.

The control circuit 7 may transmit a control signal CNT to the switch circuits 1, 2, 3, and 4 and to the signal processing circuits 5 and 6. Whether the switch circuits 1, 2, 3, and 4 are respectively in an ON state or OFF state is controlled by a control signal CNT that the switch circuit receives from the control circuit 7. While a switch circuit is in the ON state, this switch circuit can transfer a signal between the first end and the second end of the switch circuit. On the other hand, while the switch circuit is in the OFF state, this switch circuit conducts no transfer between the first end and second end of the switch circuit. Each of the signal processing circuits 5 and 6 performs signal processing based on a control signal CNT received from the control circuit 7.

The first end of the switch circuit 1 is coupled to the antenna ANT, while the second end of the switch circuit 1 is coupled to the signal processing circuit 5. The switch circuit 1 receives a control signal CNT1 from the control circuit 7. A switch circuit 1 that is currently in the ON state in response to the control signal CNT1 transports a high-frequency signal received by the wireless device WD via the antenna ANT to the signal processing circuit 5.

The first end of the switch circuit 2 is coupled to the signal path between the switch circuit 1 and the signal processing circuit 5. The second end of the switch circuit 2 may be grounded.

The switch circuit 2 receives a control signal CNT2 from the control circuit 7. For instance, with the switch circuit 1 being in the OFF state, the switch circuit 2 is in the ON state in accordance with the control signal CNT2. The switch circuit 2, while in the ON state, sets the potential of the signal path between the switch circuit 1 and the signal processing circuit 5 to the ground potential.

The signal processing circuit 5 receives a high-frequency signal transmitted via the switch circuit 1, and executes various kinds of processing upon the high-frequency signal, based on the control signal CNT3 received from the control circuit 7.

The first end of the switch circuit 3 is coupled to the antenna ANT, while the second end of the switch circuit 3 is coupled to the signal processing circuit 6. The switch circuit 3 receives a control signal CNT2 from the control circuit 7. A switch circuit 3 that is currently in the ON state in response to the control signal CNT2 transports a high-frequency signal received by the wireless device WD via the antenna ANT to the signal processing circuit 6. The frequency band of the high-frequency signal transmitted by the switch circuit 3 differs from the frequency band of the high-frequency signal transmitted by the switch circuit 1, for example. The switch circuit 1 and switch circuit 3 may be selectively turned to the ON state under the control of the control circuit 7.

The first end of the switch circuit 4 is coupled to the signal path between the switch circuit 3 and the signal processing circuit 6. The second end of the switch circuit 4 may be grounded. The switch circuit 4 receives a control signal CNT1 from the control circuit 7. For instance, with the switch circuit 3 being in the OFF state, the switch circuit 4 is in the ON state in accordance with the control signal CNT1. The switch circuit 4, while in the ON state, sets the potential of the signal path between the switch circuit 3 and signal processing circuit 6 to the ground potential.

The signal processing circuit 6 receives a high-frequency signal transmitted via the switch circuit 3, and executes various kinds of processing upon the high-frequency signal, based on the control signal CNT4 received from the control circuit 7.

In the above description, each of the switch circuits 1 and 3 transmits the high-frequency signal that the wireless device WD has received from other devices. The switch circuits 1 and 3 are not limited to this description. Each of the switch circuits 1 and 3 may transmit a high-frequency signal that the wireless device WD transmits to other devices.

The following description will focus on the switch circuit 1. The same description as for the switch circuit 1 applies to each of the switch circuits 2, 3, and 4.

(2) Switch Circuit

FIG. 2 shows an exemplary circuitry configuration of the switch circuit 1 of the first embodiment. FIG. 2 shows voltages VD, VG, and VB, which will be discussed later in the description of the effects.

The switch circuit 1 may include the number 2n (where n is a natural number) of transistors M1, M2, M3, M4, M5, M6, . . . , M(2n−1), and M(2n). Each of these transistors may be a field effect transistor (FET) such as an n-channel metal oxide semiconductor (MOS) transistor. In FIG. 2, the first end and second end of the switch circuit 1 are respectively indicated as a terminal IN and a terminal OUT.

The switch circuit 1 further includes resistors Rg1, Rg2, Rg3, Rg4, Rg5, Rg6, . . . , Rg(2n−1), and Rg(2n). The switch circuit 1 also includes resistors Rds(1, 1), Rds(1, 2), Rds(2, 1), Rds(2, 2), Rds(3, 1), Rds(3, 2), Rds(4, 1), Rds(4, 2), Rds(5, 1), Rds(5, 2), Rds(6, 1), Rds(6, 2), . . . , Rds(2n−1, 1), Rds(2n−1, 2), Rds(2n, 1), and Rds(2n, 2).

All of the resistors Rds(1, 1), Rds(1, 2), Rds(2, 1), Rds(2, 2), Rds(3, 1), Rds(3, 2), Rds(4, 1), Rds(4, 2), Rds(5, 1), Rds(5, 2), Rds(6, 1), Rds(6, 2), . . . , Rds(2n−1, 1), Rds(2n−1, 2), Rds(2n, 1), and Rds(2n, 2) have substantially the same resistance value, R1. In the following description, it is assumed that the resistance values of these resistors Rds are substantially equal to each other.

The transistors M1, M2, M3, M4, M5, M6, . . . , M(2n−1), and M(2n) are coupled in series between the terminal IN and terminal OUT. In particular, the terminal IN is coupled to the first end of the transistor M1, and the second end of the transistor M1 is coupled to the first end of the transistor M2. The second end of the transistor M2 is coupled to the first end of the transistor M3, and the second end of the transistor M3 is coupled to the first end of the transistor M4. The same coupling relationship is applied to the transistors M4, M5, M6, . . . , M(2n−1), and M(2n). The second end of the transistor M(2n) is coupled to the terminal OUT.

The gate (hereinafter it may also be referred to as a "control terminal") of the transistor M1 is coupled to one end of the resistor Rg1. The gate of the transistor M2 is coupled to one end of the resistor Rg2. The gate of the transistor M3 is coupled to one end of the resistor Rg3. The same applies to the resistors Rg4, Rg5, Rg6, . . . , Rg(2n−1), and Rg(2n). The other ends of the resistor Rg1, resistor Rg2, resistor Rg3, . . . , resistor Rg(2n−1), and resistor Rg(2n) are coupled to a node through which a signal GB is input. FIG. 2 shows a control terminal through which a signal GB is input to the switch circuit 1. The signal GB may be the control signal CNT1 discussed with reference to FIG. 1. The signal GB is switched, for example by the control circuit 7, between a high (H) level and a low (L) level. Throughout the specification, the term "level" represents a voltage level, unless otherwise specified.

The first end of the transistor M1 is coupled to one end of the resistor Rds(1, 1), the other end of the resistor Rds(1, 1) is coupled to one end of the resistor Rds(1, 2), and the other end of the resistor Rds(1, 2) is coupled to the second end of the transistor M1. The first end of the transistor M2 is coupled to one end of the resistor Rds(2, 1), the other end of the resistor Rds(2, 1) is coupled to one end of the resistor Rds(2, 2), and the other end of the resistor Rds(2, 2) is coupled to the second end of the transistor M2. The first end of the transistor M3 is coupled to one end of the resistor Rds(3, 1), the other end of the resistor Rds(3, 1) is coupled to one end of the resistor Rds(3, 2), and the other end of the resistor Rds(3, 2) is coupled to the second end of the transistor M3. The same applies to the resistors Rds(4, 1), Rds(4, 2), Rds(5, 1), Rds(5, 2), Rds(6, 1), Rds(6, 2), . . . , Rds(2n−1, 1), Rds(2n−1, 2), Rds(2n, 1), and Rds (2n, 2).

The switch circuit 1 further includes diodes D(1, 1), D(2, 1), D(3, 1), D(4, 1), D(5, 1), D(6, 1), . . . , D(2n−1, 1), and D(2n, 1). All of the diodes accompanied by a symbol D in this specification are diodes of a PN junction.

The anode of the diode D(1, 1) is coupled to the body (also referred to as a "back gate") of the transistor M1, and the cathode of the diode D(1, 1) is coupled to the gate of the transistor M1. The anode of the diode D(2, 1) is coupled to the body of the transistor M2, and the cathode of the diode D(2, 1) is coupled to the gate of the transistor M2. The anode of the diode D(3, 1) is coupled to the body of the transistor M3, and the cathode of the diode D(3, 1) is coupled to the gate of the transistor M3. The same applies to the diodes D(4, 1), D(5, 1), D(6, 1), . . . , D(2n−1, 1), and D(2n, 1).

The switch circuit 1 further includes, as structural components of feedback circuits, diodes D(1, 2), D(2, 2), D(3, 2), D(4, 2), D(5, 2), D(6, 2), . . . , D(2n−1, 2), and D(2n, 2). The following holds when the integer k is any integer between 1 to n.

The anode of the diode D(2k−1, 2) is coupled to the body of the transistor M(2k−1), and the cathode of the diode D(2k−1, 2) is coupled to a node mutually coupling the resistor Rds(2k, 1) and the resistor Rds(2k, 2). That is, the diode D(2k−1, 2) is coupled between the body of the transistor M(2k−1) and the second end of the transistor M(2k).

The anode of the diode D(2k, 2) is coupled to the body of the transistor M(2k), and the cathode of the diode D(2k, 2) is coupled to a node mutually coupling the resistor Rds(2k−1, 1) and the resistor Rds(2k−1, 2). That is, the diode D(2k, 2) is coupled between the body of the transistor M(2k) and the first end of the transistor M(2k−1).

As described above, with regard to each pair of the transistors M(2k−1) and M(2k), the diodes D(2k−1, 2) and D(2k, 2) are coupled as structural components of a feedback circuit in the switch circuit 1. For instance, a diode D(2k−1, 2) is coupled as a structural component of a feedback circuit to the body of the transistor M(2k−1), and a diode D(2k, 2) is coupled as a structural component of the feedback circuit to the body of the transistor M(2k). When the integer k is 2 or greater, no diode is provided between the body of the transistor M(2k−1) and the first end of the transistor M(2k−2). When the integer k is n−1 or smaller, no diode is provided between the body of the transistor M(2k) and the second end of the transistor M(2k+1).

With the signal GB being at an H level, the transistors M1, M2, M3, M4, M5, M6, . . . , M(2n−1), and M(2n) are in the ON state, which means that the switch circuit 1 is in the ON state.

With the signal GB being at an L level, the transistors M1, M2, M3, M4, M5, M6, . . . , M(2n−1), and M(2n) are in the OFF state, or in other words, the switch circuit 1 is in the OFF state. With the switch circuit 1 being in the OFF state, since the resistors Rds have the above-mentioned coupling relationship, the voltage applied between the terminal IN and terminal OUT is divided, and the divided voltages are respectively applied to the transistors M1, M2, M3, M4, M5, M6, . . . , M(2n−1), and M(2n). The voltages applied to the transistors M1, M2, M3, M4, M5, M6, . . . , M(2n−1), and M(2n) are substantially equal to each other.

When the potential (hereinafter this may also be referred to as a "voltage") at the body of the transistor M1 is higher than the voltage at the gate of the transistor M1, a current may flow from the body via the diode D(1, 1).

The above description relates to the diode D(1, 1) coupled between the body and gate of the transistor M1. For other transistors M, the same description holds in relation to the diode D coupled between the body and gate of a transistor M.

When the voltage at the body of the transistor M1 is higher than the voltage at a node mutually coupling resistor Rds(2, 1) and resistor Rds(2, 2), a current may flow from the body via the diode D(1, 2).

When the voltage at the body of the transistor M2 is higher than the voltage at a node mutually coupling the resistor Rds(1, 1) and resistor Rds(1, 2), a current may flow from the body via the diode D(2, 2).

The above description relates to the diodes D(1, 2) and D(2, 2) respectively coupled to the bodies of the transistors M1 and M2. For other transistors M, the same description holds in relation to the diodes D coupled as structural components of the feedback circuits to the bodies of the transistors M.

In the above description, the cathode of the diode D(2, 2) is coupled to the node mutually coupling the resistor Rds(1, 1) and resistor Rds(1, 2), for example. When the resistance value of the resistor Rds(1, 1) is extremely small, this coupling relationship may be interpreted as the cathode of the diode D(2, 2) being coupled to the first end of the transistor M1 without a resistor element interposed. When the resistance value of the resistor Rds(1, 1) is extremely small, the resistance value of the resistor Rds(1, 2) differs from the resistance value of the resistor Rds(1, 1). The same holds for other diodes D having a similar coupling relationship.

Figure 3:
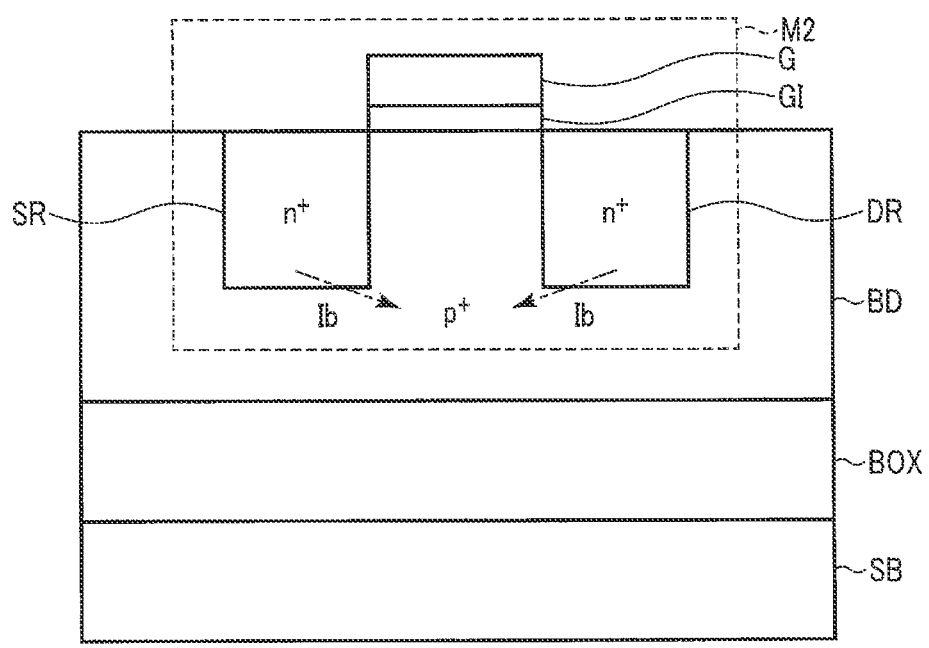
FIG. 3 is a diagram for explaining the configuration of a transistor in the switch circuit of the first embodiment.

FIG. 3 is a diagram for explaining the configuration of the transistor M2 in the switch circuit 1 of the first embodiment. FIG. 3 shows a partial cross-sectional structure of the switch circuit 1. In the following description, the structure of the transistor M2 will be discussed as an example. Other transistors M may have a similar structure. The switch circuit 1 arranged on a silicon-on-insulator (SOI) substrate will be described as an example.

An oxide film BOX is formed on the top surface of the semiconductor substrate SB. A semiconductor layer is deposited as a body layer BD on the top surface of the oxide film BOX. The body layer BD may be doped, for example, with boron (B), and used as a $p^+$ impurity diffusion layer. The source region SR and drain region DR are arranged on the surface of the body layer BD and spaced apart from each other. The source region SR and drain region DR may be doped, for example, with phosphorus (P) and thereby used as $n^+$ impurity diffusion regions. A gate electrode G is formed on the top surface of the body layer BD between the source region SR and drain region DR with a gate insulator GI interposed. The transistor M2 includes the source region SR, drain region DR, and gate electrode G.

Coupling between the gate of the transistor M2 and other structural components is established by way of a contact plug (not shown) formed on the top surface of the gate electrode G. Similarly, coupling between the first end of the transistor M2 and other structural components and between the second end of the transistor M2 and other structural components is established by way of the contact plugs (not shown) formed on the top surfaces of the drain region DR and source region SR.

For instance, when the voltage of the drain region DR is higher than the voltage of the body layer BD, a leak current Ib may be generated to flow from the drain region DR to the body layer BD. Similarly, when the voltage of the source region SR is higher than the voltage of the body layer BD, a leak current Ib may be generated to flow from the source region SR to the body layer BD.

With such leak currents Ib, the voltage at the body of the transistor M2 may increase. Since the current flows through the diode D coupled to the body of the transistor M2, the increase in the voltage can be suppressed.

(Exemplary Operation)

Figure 5:
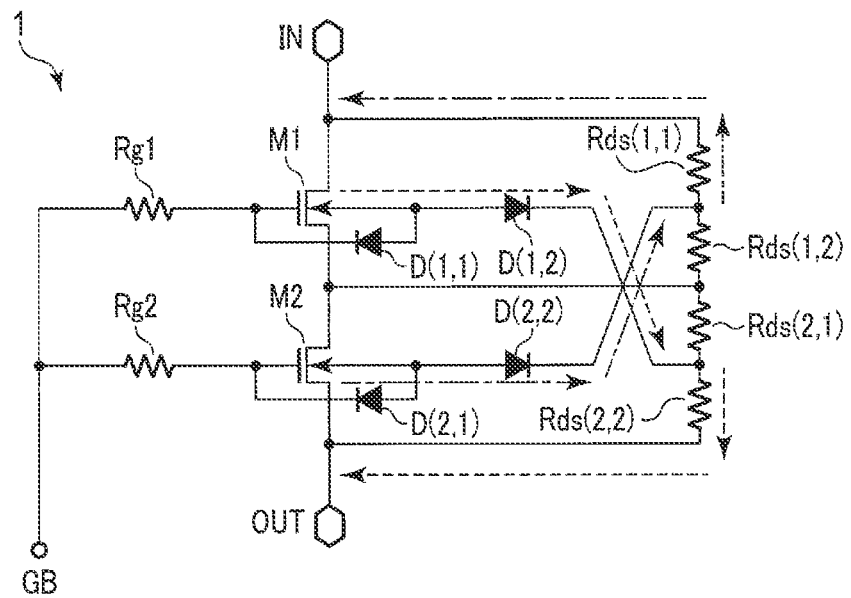
FIG. 5 is a diagram for explaining various currents flowing in the switch circuit of the first embodiment in an OFF state.

The exemplary operation of the switch circuit 1 of the first embodiment will be described below with reference to FIGS. 4 and 5. For the sake of simplicity, FIGS. 4 and 5 show the circuit structure of the switch circuit 1 where n is 1. It is assumed below that n is equal to 1. The same description holds when n is any other integer.

FIG. 4 is a diagram for explaining various bias voltages used in the switch circuit 1 of the first embodiment. The voltage values mentioned below are mere examples for brevity of the description.

In (a) of FIG. 4, various bias voltages used with the switch circuit 1 in the ON state are indicated.

It is assumed that a voltage of 0 volts (V) is applied as a bias voltage to the terminal IN and terminal OUT.

The signal GB is currently at the H level, having a voltage of 3 V, and therefore the bias potential (hereinafter it may also be referred to as a "bias voltage") at the gate of each of the transistors M1 and M2 is also 3 V.

The bodies of the transistors M1 and M2 are in the floating state, and the bias voltage at each of the transistors M1 and M2 is 0 V, for example. This may be based on the parasitic capacitances produced between the body and first end of the transistor M1, between the body and second end of the transistor M1, between the body and first end of the transistor M2, and between the body and second end of the transistor M2.

With such a relationship between the bias voltages, the voltage at the body of the transistor M1 is lower than the voltage at the gate of the transistor M1. Thus, a current does not flow via the diode D(1, 1), and the bias voltage at the body of the transistor M1 is maintained at 0 V. Similarly, the bias voltage at the body of the transistor M2 is also maintained at 0 V.

In (b) of FIG. 4, various bias voltages used with the switch circuit 1 in the OFF state are indicated.

A voltage of 0 V is applied as a bias voltage to the terminal IN and terminal OUT.

The signal GB is currently at the L level, having a voltage of −3 V, and therefore the bias voltage at the gate of each of the transistors M1 and M2 is −3 V.

When the bias voltage at the body of the transistor M1 is 0 V and the voltage at the body of the transistor M1 is higher than the voltage at the gate of the transistor M1, a current flows from the body via the diode D(1, 1). As a result, the bias voltage at the body falls, and becomes stable at −2.4 V, which is a voltage higher by the threshold voltage of the diode D(1, 1) than the bias voltage of −3 V at the gate. Similarly, the bias voltage at the body of the transistor M2 becomes stable at −2.4 V.

FIG. 5 is a diagram for explaining various currents that flow in the switch circuit 1 of the first embodiment while in the OFF state.

In response to a high-frequency signal input to the terminal IN, the leak current Ib explained with reference to FIG. 3 may be generated at the transistors M1 and M2. In the switch circuit 1, a current may flow via the feedback circuit as described below.

The leak current Ib generated at the transistor M1 may increase the bias voltage at the body of the transistor M1. When the voltage at the body is higher than the voltage at the node coupling the resistor Rds(2, 1) and resistor Rds(2, 2), a current may flow from the body via the diode D(1, 2) and resistor Rds(2, 2) to the node coupling the resistor Rds(2, 2) and the second end of the transistor M2. This can suppress an increase in the bias voltage at the body.

The leak current Ib generated at the transistor M2 may increase the bias voltage at the body of the transistor M2. When the voltage at the body is higher than the voltage at the node coupling the resistor Rds(1, 1) and resistor Rds(1, 2), a current may flow from the body via the diode D(2, 2) and resistor Rds(1, 1) to the node coupling the resistor Rds(1, 1) and the first end of the transistor M1. This can suppress an increase in the bias voltage at the body.

Effects

Figure 6:
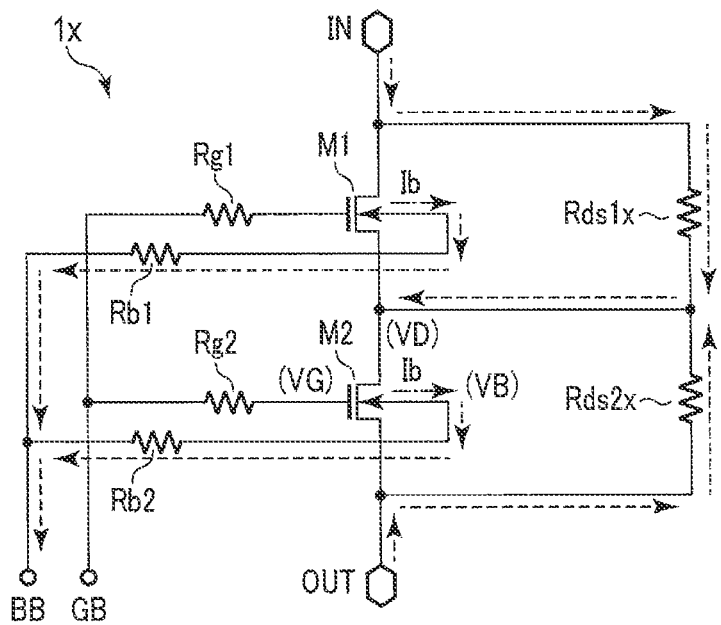
FIG. 6 is a diagram for showing an exemplary circuitry configuration of a switch circuit of a comparative example of the first embodiment.

FIG. 6 shows an exemplary circuitry configuration of a switch circuit 1x of a comparative example of the first embodiment.

In the circuitry configuration of the switch circuit 1x in FIG. 6, no diode is provided as a structural component of the feedback circuit in the circuitry configuration of the switch circuit 1 when n is 1 so that the body of transistor M1 is coupled via the resistor Rb1 to the node through which a signal BB is input, and the body of the transistor M2 is coupled via the resistor Rb2 to this node. The voltage of the signal BB is set in accordance with the voltage of the signal GB. In FIG. 6, the resistor coupled between the first end and second end of the transistor M1 is indicated as a resistor Rds1x, and the resistor coupled between the first end and second end of the transistor M2 is indicated as a resistor Rds2x.

The operation of the switch circuit 1x being in the OFF state will be described.

In response to a high-frequency signal input to the terminal IN, the leak current Ib explained with reference to FIG. 3 may be generated at the transistors M1 and M2 of the switch circuit 1x.

Such a leak current Ib may increase the bias voltages at the bodies of the transistors M1 and M2. This will be described in detail below.

The leak current Ib may affect the flow of the current from the body of the transistor M1 via the resistor Rb1, and the current from the body of the transistor M2 via the resistor Rb2. Thus, the amount of voltage drop changes across the resistors Rb. The amounts of the increase in the bias voltages at the bodies of the transistors M1 and M2 depend on this amount of change in the voltage drop.

Such a leak current Ib also lowers the bias voltages at the second end of the transistor M1 and the first end of the transistor M2. This will be described in detail below.

The leak current Ib may affect the flow of the current from the terminal IN via the resistor Rds1x to the node coupling the second end of the transistor M1 and the first end of the transistor M2 and the flow of the current from the terminal OUT via the resistor Rds2x to this node. This changes the amounts of voltage drop across the resistors Rds. The amounts of drop of the bias voltage at the second end of the transistor M1 and at the first end of the transistor M2 depend on the respective amounts of change in the voltage drop.

In the above description, two transistors M are serially coupled between the terminal IN and terminal OUT. The description holds for any other number of transistors M serially coupled between the terminal IN and terminal OUT. That is, the leak current Ib generated in a transistor M may increase the bias voltage at the body of the transistor M, while lowering the bias voltages at the first end and/or second end of the transistor M.

As a result of this, the potential difference between the body and drain of the transistor M is narrowed, which can easily turn the parasitic bipolar transistor between the drain and source of the transistor M to the ON state. The parasitic bipolar transistor of a transistor M that is turned to the ON state increases voltages applied to other transistors M, thereby lowering the voltage withstanding property of the switch circuit 1x.

In the switch circuit 1 of the first embodiment, as explained with reference to FIG. 5, a current flows via a feedback circuit. Thus, an increase in the bias voltage at the body of each transistor M can be suppressed, and a decrease in the bias voltage at the first end and/or second end of the transistor M can also be suppressed.

Figure 7:
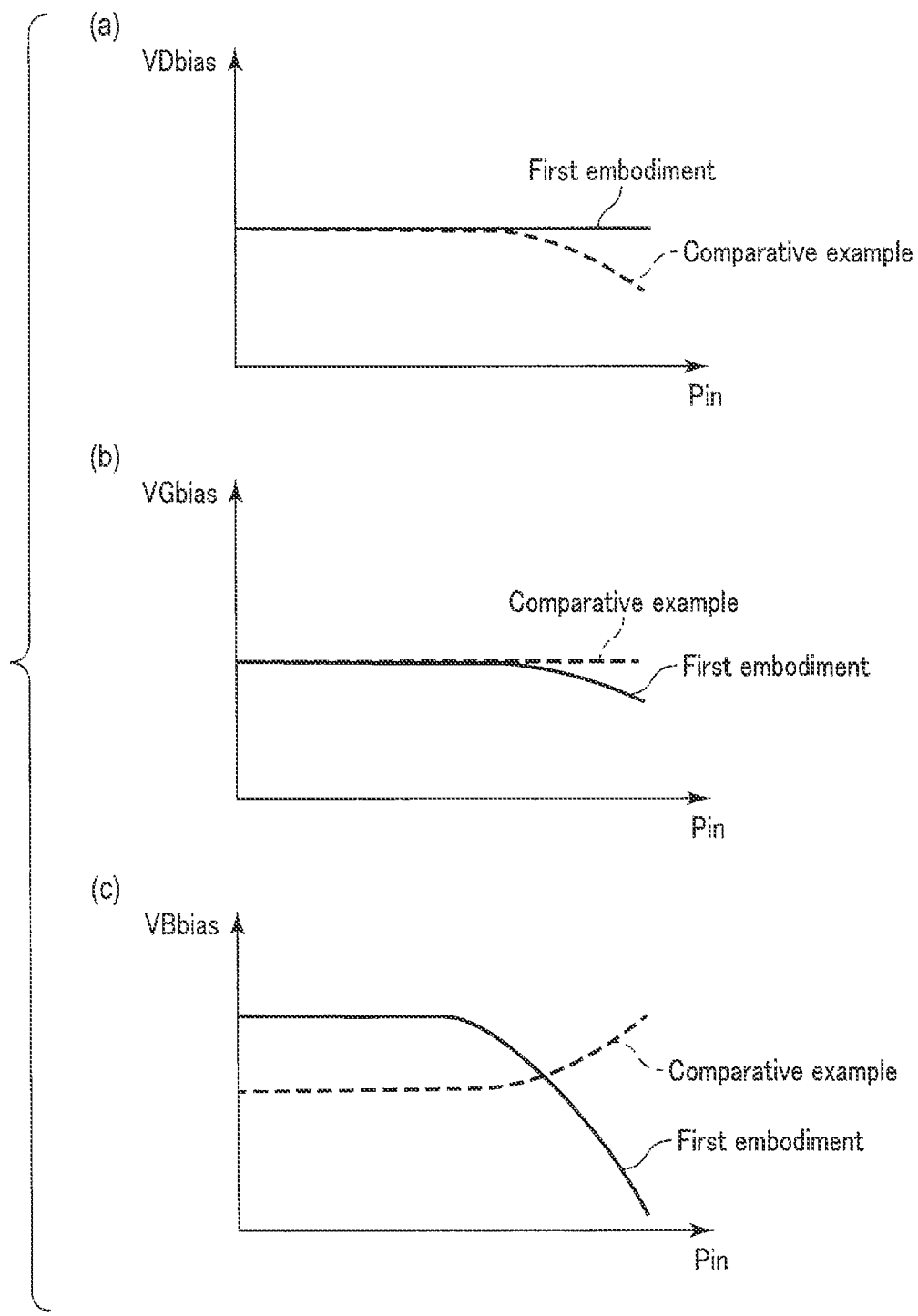
FIG. 7 is a diagram including exemplary graphs representing relationships between the high-frequency power of a high-frequency signal input to the switch circuit of the first embodiment in the OFF state and the bias voltages at the first end, gate, and body of a transistor.

FIG. 7 is a diagram including exemplary graphs representing the relationships between the high-frequency power Pin of the high-frequency signal and the bias voltage at each of the first end, gate, and body of the transistor M2 in response to a high-frequency signal input to the switch circuit 1 with the switch circuit 1 of the first embodiment being in the OFF state. FIG. 7 also includes graphs for the switch circuit 1x of the comparative example of the first embodiment.

The graph (a) of FIG. 7 represents the relationship between the high-frequency power Pin and the bias voltage VDbias at the first end of the transistor M2, where the horizontal axis indicates the value of the high-frequency power Pin, and the vertical axis indicates the value of the bias voltage VDbias.

In the switch circuit 1x of the comparative example, as the high-frequency power Pin increases, a leak current Ib is produced at the transistor M2, which lowers the bias voltage VDbias, as described above. In contrast, in the switch circuit 1 of the first embodiment, the bias voltage VDBias does not fall even if the high-frequency power Pin increases, as described above.

The graph (b) of FIG. 7 represents the relationship between the high-frequency power Pin and the bias voltage VGbias at the gate of the transistor M2, where the horizontal axis indicates the value of the high-frequency power Pin and the vertical axis indicates the value of the bias voltage VGbias.

In the switch circuit 1x of the comparative example, the bias voltage VGbias remains substantially constant regardless of the high-frequency power Pin. In the switch circuit 1 of the first embodiment, the bias voltage VGbias is also substantially constant regardless of the high-frequency power Pin. In the example of (b) in FIG. 7, however, the bias voltage VGbias is indicated as being lowered as the high-frequency power Pin continues to increase.

The graph (c) of FIG. 7 represents the relationship between the high-frequency power Pin and the bias voltage VBbias at the body of the transistor M2, where the horizontal axis indicates the value of the high-frequency power Pin, and the vertical axis indicates the value of the bias voltage VBbias. In the comparative example, the voltage of the signal BB is substantially the same as the voltage of the signal GB at the L level.

In the switch circuit 1x of the comparative example, as the high-frequency power Pin increases, a leak current Ib is produced in the transistor M2, which increases the bias voltage VBbias, as described above. In contrast, in the switch circuit 1 of the first embodiment, even if the high-frequency power Pin increases and produces a leak current Ib at the transistor M2, the bias voltage VBbias does not increase from a voltage higher by the threshold voltage of the diode D(2, 1) than the voltage of the signal GB at the L level. In the example of (c) in FIG. 7, the bias voltage VBbias decreases as the high-frequency power Pin increases. This decrease is also based on the flow of the current via the diode D(2, 2) as previously mentioned, where the diode D(2, 2) rectifies the current based on the AC voltage applied to the two ends of the diode D(2, 2). The decrease in the bias voltage VGbias indicated in (b) of FIG. 7 is based on an AC signal at the body of the transistor M2, which affects the voltage applied to the diode D(2, 1) between the gate and body of the transistor M2.

In the switch circuit 1 of the first embodiment, even if a current that flows via the feedback circuit as described with reference to FIG. 5 causes a leak current Ib at a transistor M, an increase in the bias voltage at the body of the transistor M can be suppressed, and a decrease in the bias voltages at the first end and/or second end of the transistor M can be suppressed. In this manner, the switch circuit 1 of the first embodiment can prevent its high-voltage withstanding property from being lowered by the leak current Ib produced at the transistor M.

Furthermore, in the switch circuit 1 of the first embodiment, as described with reference to FIG. 4, with the switch circuit 1 being in the OFF state, the diode D between the body and gate of each transistor M is biased in the forward direction so that the impedance of the diode D stays low, while with the switch circuit 1 being in the ON state, the diode D is biased in the reverse direction so that the impedance of the diode D stays high. Thus, with the switch circuit 1 of the first embodiment being in the ON state, the gate impedance with respect to the channel of each transistor M is high, as a result of which a loss in the high-frequency signal becomes small at the time of transmission by the switch circuit 1 via the transistor M.

In the switch circuit 1 of the first embodiment, the following holds when the integer k is any integer between 1 and n.

The anode of the diode D(2k−1, 2) is coupled to the body of the transistor M(2k−1), and the cathode of the diode D(2k−1, 2) is coupled to the node mutually coupling the resistor Rds(2k, 1) and the resistor Rds(2k, 2). The resistors Rds(2k, 1) and Rds(2k, 2) are serially coupled between the first end and second end of the transistor M(2k).

The anode of the diode D(2k, 2) is coupled to the body of the transistor M(2k), and the cathode of the diode D(2k, 2) is coupled to the node mutually coupling the resistor Rds (2k−1, 1) and the resistor Rds(2k−1, 2). The resistors Rds(2k−1, 1) and Rds(2k−1, 2) are serially coupled between the first end and second end of the transistor M(2k−1).

As described above, the diodes D(2k−1, 2) and D(2k, 2) are evenly coupled as structural components of a feedback circuit for each pair of the transistors M(2k−1) and M(2k).

In addition, in the switch circuit 1 of the first embodiment, the number of diodes D as structural components of a feedback circuit for each transistor M can be reduced in comparison with the structure in which the cathode of the diode D(2k−1, 2) is coupled to the second end of the transistor M(2k) without a resistor interposed, and the cathode of the diode D(2k, 2) is coupled to the first end of the transistor M(2k−1) without a resistor interposed. In the example of FIG. 2, the number of diodes is 1. The reduction in the number of diodes D can be realized because of the voltages that establish the relationship of voltages as indicated below. In response to a high-frequency signal input to the terminal IN, the maximum voltage that can be applied between the body of the transistor M(2k−1) and the node coupling the resistor Rds(2k, 1) and the resistor Rds(2k, 2) is lower than the maximum voltage that can be applied between this body and the second end of the transistor M(2k). Furthermore, the maximum voltage that can be applied between the body of the transistor M(2k) and the node coupling the resistor Rds(2k−1, 1) and the resistor Rds(2k−1, 2) is lower than the maximum voltage that can be applied between this body and the first end of the transistor M(2k−1).

As a result of the above, the diodes D used as feedback circuits are evenly coupled in the switch circuit 1 of the first embodiment, and enhance the high-voltage withstanding property of the switch circuit 1. Furthermore, simplification and downsizing of the circuitry configuration can be attained.

Second Embodiment

A switch circuit 1a of the second embodiment will be described below.

The configuration, operation and effects of the switch circuit 1a of the second embodiment will be described by mainly focusing on the differences with respect to the switch circuit 1 of the first embodiment.

The description of the switch circuit 1 made with reference to FIG. 1 is applied to the switch circuit 1a. In particular, the switch circuit 1 is replaced with the switch circuit 1a in the description of FIG. 1. Although the following description will focus on the switch circuit 1a, the same description as for the switch circuit 1a applies to each of the switch circuits 2, 3, and 4.

Figure 8:
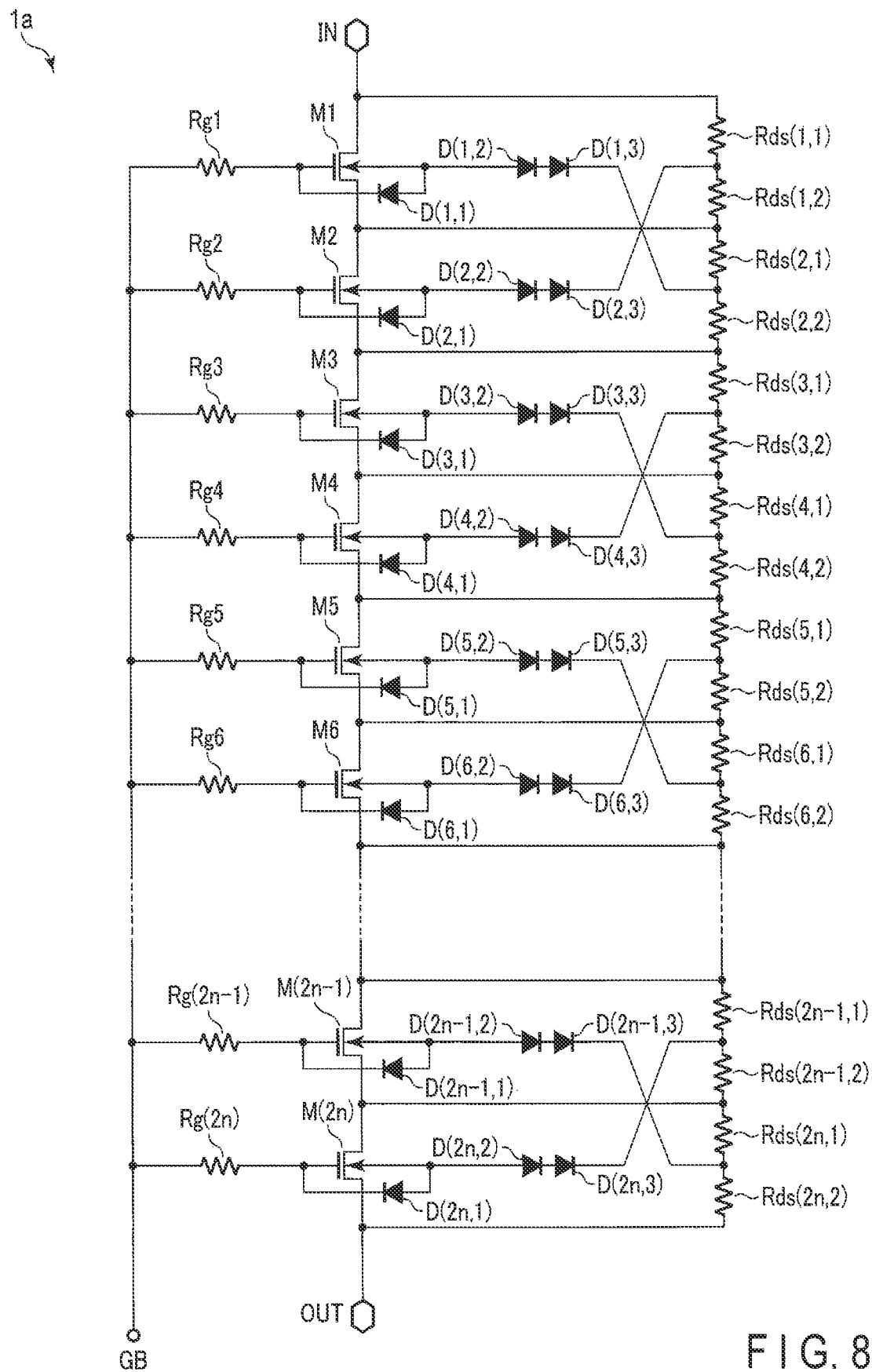
FIG. 8 is a diagram for showing an exemplary circuitry configuration of a switch circuit of the second embodiment.

FIG. 8 shows an exemplary circuitry configuration of the switch circuit 1a of the second embodiment.

In addition to the configuration of the switch circuit 1, the switch circuit 1a further includes the number 2n of diodes, D(1, 3), D(2, 3), D(3, 3), D(4, 3), D(5, 3), D (6, 3), . . . , D (2n−1, 3), and D (2n, 3). The switch circuit 1a has a circuitry configuration, in which the number of diodes D arranged as the structural components of the feedback circuits for each transistor M is set to 2 instead of 1 in the circuitry configuration of the switch circuit 1 described with reference to FIG. 2. This configuration will be described in detail below.

The anode of the diode D(1, 3) is coupled to the cathode of the diode D(1, 2), while the cathode of the diode D(1, 3) is coupled to the node mutually coupling the resistor Rds(2, 1) and the resistor Rds(2, 2). The anode of the diode D(2, 3) is coupled to the cathode of the diode D(2, 2), while the cathode of the diode D(2, 3) is coupled to the node coupling the resistor Rds(1, 1) and the resistor Rds(1, 2). The same applies to the diodes D(3, 3), D(4, 3), D(5, 3), D(6, 3), . . . , D(2n−1, 3), and D(2n, 3).

In the above example, two diodes D are arranged as the structural components of a feedback circuit for every transistor M. The present embodiment, however, is not limited thereto. In the same manner as above, three or more diodes D may be arranged as the structural components of a feedback circuit for every transistor M.

In the switch circuit 1a of the second embodiment, the number of diodes D arranged as the structural components of the feedback circuit for each transistor M can be suitably changed in consideration of the high-voltage withstanding property of the diodes D. The number may be determined based on the amplitude of a high-frequency signal slated to be input to the terminal IN.

Third Embodiment

A switch circuit 1b of the third embodiment will be described below.

The configuration, operation and effects of the switch circuit 1b of the third embodiment will be described by mainly focusing on the differences with respect to the switch circuit 1 of the first embodiment.

The description of the switch circuit 1 made with reference to FIG. 1 is applied to the switch circuit 1b. In particular, the switch circuit 1 is replaced with the switch circuit 1b in the description of FIG. 1. Although the following description will focus on the switch circuit 1b, the same description as for the switch circuit 1b applies to each of the switch circuits 2, 3, and 4.

FIG. 9 shows an exemplary circuitry configuration of the switch circuit 1b of the third embodiment.

In comparison with the circuitry configuration of FIG. 2 for the switch circuit 1, the switch circuit 1b has a circuitry configuration in which the resistor between the first end and second end of each of the transistors M, i.e., each of the transistors M1, M2, M3, . . . , and M(2n), is replaced as described below. The following holds when the integer i is any integer between 1 to n.

The resistors Rds(2i−1, 1) and Rds(2i−1, 2) coupled between the first end and second end of the transistor M(2i−1) are replaced with the resistors Rds(2i−1, 1)b and Rds(2i−1, 2)b. In particular, the first end of the transistor M(2i−1) is coupled to one end of the resistor Rds(2i−1, 1)b, the other end of the resistor Rds(2i−1, 1)b is coupled to one end of the resistor Rds(2i−1, 2)b, and the other end of the resistor Rds(2i−1, 2)b is coupled to the second end of the transistor M(2i−1).

The resistors Rds(2i, 1) and Rds(2i, 2) coupled between the first end and second end of the transistor M(2i) are replaced with the resistors Rds(2i, 1)b and Rds(2i, 2)b. In particular, the first end of the transistor M(2i) is coupled to one end of the resistor Rds(2i, 1)b, the other end of the resistor Rds(2i, 1)b is coupled to one end of the resistor Rds(2i, 2)b, and the other end of the resistor Rds(2i, 2)b is coupled to the second end of the transistor M(2i).

The cathode of the diode D(2i−1, 2) is coupled to the node coupling the resistor Rds(2i, 1)b and the resistor Rds(2i, 2)b. The cathode of the diode D(2i, 2) is coupled to the node mutually coupling the resistor Rds(2i−1, 1)b and the resistor Rds(2i−1, 2)b.

In the case of the integer i being any of 1 to n, the resistance values of the resistor Rds(2i−1, 1)b and resistor Rds(2i, 2)b are both substantially R2, and the resistance values of the resistor Rds(2i−1, 2)b and resistor Rds(2i, 1)b are both substantially three times larger than the value of R2.

In the above example, the resistor Rds(1, 1)b has the resistance value of R2, and the resistor Rds(1, 2)b has a resistance value three times larger than R2. The present embodiment, however, is not limited thereto. The ratio of the resistance value of the resistor Rds(1, 1)b to the resistance value of the resistor Rds(1, 2)b may take a different value. For instance, the resistance value of the resistor Rds(1, 1)b may be one-third to three times larger than the resistance value of the resistor Rds(1, 2)b. The same applies to other resistors Rds(2, 1)b, Rds(2, 2)b, Rds(3, 1)b, Rds(3, 2)b, . . . , Rds(2n, 1)b, and Rds(2n, 2)b.

The switch circuit 1b of the third embodiment can adjust the maximum voltage that can be applied to each diode D, which serves as a structural component of the feedback circuit, in response to a high-frequency signal input to the terminal IN. With such an adjustment, the effects of drawing a current from the body of each transistor M by the feedback circuit can be adjusted in consideration of the high-voltage withstanding property of each diode D that serves as a structural component of the feedback circuit.

Fourth Embodiment

The switch circuit 1c of the fourth embodiment will be described below.

The configuration, operation and effects of the switch circuit 1c of the fourth embodiment will be described by mainly focusing on the differences with respect to the switch circuit 1 of the first embodiment.

The description of the switch circuit 1 made with reference to FIG. 1 is applied to the switch circuit 1c. In particular, the switch circuit 1 is replaced with the switch circuit 1c in the description of FIG. 1. Although the following description will focus on the switch circuit 1c, the same description as for the switch circuit 1c applies to each of the switch circuits 2, 3, and 4.

FIG. 10 shows an exemplary circuitry configuration of the switch circuit 1c of the fourth embodiment.

The circuitry configuration of the switch circuit 1c corresponds to the circuitry configuration of the switch circuit 1, in which the body of the transistors M is coupled via a resistor to the node to which a signal BB is input for each of the transistors M1, M2, M3, . . . , and M(2n). As such resistors, the switch circuit 1c includes resistors Rb1, Rb2, Rb3, Rb4, Rb5, Rb6, . . . , Rb(2n−1), and Rb(2n).

The body of the transistor M1 is coupled to one end of the resistor Rb1. The body of the transistor M2 is coupled to one end of the resistor Rb2. The body of the transistor M3 is coupled to one end of the resistor Rb3. The same applies to the resistors Rb4, Rb5, Rb6, . . . , Rb(2n−1), and Rb(2n). The other end of the resistor Rb1, the other end of the resistor Rb2, the other end of the resistor Rb3, . . . , the other end of the resistor Rb(2n−1), and the other end of the resistor Rb(2n) are coupled to the node to which a signal BB is input. FIG. 10 also illustrates a control terminal through which a signal BB is input to the switch circuit 1c. The signal BB may be supplied by the control circuit 7, and the voltage of the signal BB is set in accordance with the voltage of the signal GB.

The bias voltages at the bodies of the transistors M1, M2, M3, . . . , and M(2n) are equal to the voltage of the signal BB.

In the switch circuit 1c of the fourth embodiment, the bias voltages at the bodies of the transistors M with the switch circuit 1c being in the ON state and in the OFF state can be easily adjusted based on the voltage of the signal BB in such a manner as to enhance the high-voltage withstanding property of the switch circuit 1c.

Fifth Embodiment

The switch circuit 1d of the fifth embodiment will be described below.

The configuration, operation and effects of the switch circuit 1d of the fifth embodiment will be described by mainly focusing on the differences with respect to the switch circuit 1 of the first embodiment.

The description of the switch circuit 1 made with reference to FIG. 1 is applied to the switch circuit 1d. In particular, the switch circuit 1 is replaced with the switch circuit 1d in the description of FIG. 1. Although the following description will focus on the switch circuit 1d, the same description as for the switch circuit 1d applies to each of the switch circuits 2, 3, and 4.

FIG. 11 shows an exemplary circuitry configuration of the switch circuit 1d of the fifth embodiment.

In addition to the configuration of the switch circuit 1, the switch circuit 1d further includes a transistor M(2n+1), a resistor Rg(2n+1), a resistor Rds(2n+1, 1), a resistor Rds(2n+1, 2), a diode D(2n+1, 1), and a diode D(2n+1, 2), where the diode D(2n+1, 2) serves as a structural component of the feedback circuit.

The transistors M1, M2, M3, M4, M5, M6, . . . , M(2n−1), M(2n), and M(2n+1) are serially coupled between the terminal IN and terminal OUT. The first end of the transistor M(2n+1) is coupled to the second end of the transistor M(2n), and the second end of the transistor M(2n+1) is coupled to the terminal OUT.

The gate of the transistor M(2n+1) is coupled to one end of the resistor Rg(2n+1). The other end of the resistor Rg(2n+1) is coupled to the node through which a signal GB is input.

The first end of the transistor M(2n+1) is coupled to one end of the resistor Rds(2n+1, 1), the other end of the resistor Rds(2n+1, 1) is coupled to one end of the resistor Rds(2n+1, 2), and the other end of the resistor Rds(2n+1, 2) is coupled to the second end of the transistor M(2n+1). The resistors Rds(1, 1), Rds(1, 2), Rds(2, 1), Rds(2, 2), . . . , Rds(2n+1, 1), and Rds(2n+1, 2) have a substantially identical resistance value.

The anode of the diode D(2n+1, 1) is coupled to the body of the transistor M(2n+1), and the cathode of the diode D(2n+1, 1) is coupled to the gate of the transistor M(2n+1).

The anode of the diode D(2n+1, 2) is coupled to the body of the transistor M(2n+1), and the cathode of the diode D(2n+1, 2) is coupled to a node mutually coupling the resistor Rds(2n, 1) and the resistor Rds(2n, 2). That is, the diode D(2n+1, 2) is coupled between the body of the transistor M(2n+1) and the first end of the transistor M(2n). For instance, only the diode D(2n+1, 2) is coupled as a structural component of the feedback circuit to the body of the transistor M(2n+1).

As described above, in the switch circuit 1d of the fifth embodiment, diodes D that are used as a feedback circuit are evenly coupled. In particular, a single diode D is provided as a structural component of the feedback circuit for each transistor M, between the body of the transistor M and the first end or second end of a transistor M adjacent to this transistor M. That is, despite an odd number of transistors M included in the switch circuit 1d, the circuitry configuration of the switch circuit 1d can be simplified and downsized in the same manner as in the first embodiment.

In the same manner as in FIG. 2, a current flows from the body of the transistor M(2n+1) via the diode D(2n+1, 2). Such a current flow may contribute to the suppression of an increase in the bias voltage at the body of the transistor M(2n+1), which tends to be caused by the leak current Ib produced at the transistor M(2n+1).

Figure 12:
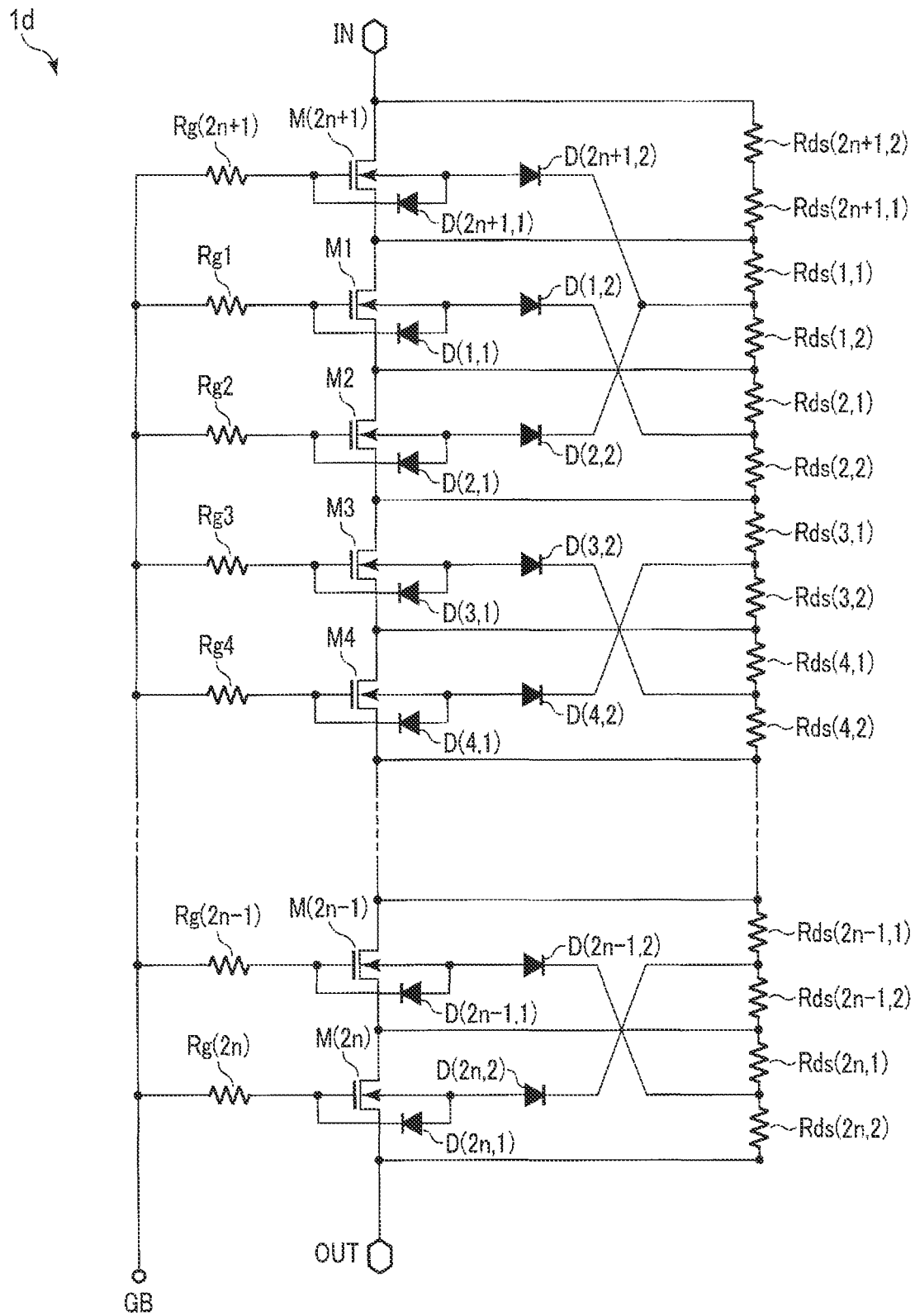
FIG. 12 is a diagram for showing another exemplary circuitry configuration of a switch circuit of the fifth embodiment.

In the above description, another transistor M(2n+1) is provided between the transistor M(2n) and the terminal OUT in the configuration of the switch circuit 1 of the first embodiment. The present embodiment is not limited thereto. As shown in FIG. 12, the same holds for the configuration in which still another transistor M is provided between the terminal IN and transistor M1 in the switch circuit 1 of the first embodiment. FIG. 12 shows another exemplary circuitry configuration of the switch circuit 1d of the fifth embodiment.

Other Embodiments

Throughout the specification, "coupling" refers to electrical connection. This coupling may include coupling with another element intervened. The "resistor" may be a resistive element or a parasitic resistance element.

In place of diodes formed of PN junctions used in a switch circuit, diode-connected transistors may be adopted. Throughout this specification, a "diode" is intended to mean possible use of a diode-connected transistor or a PN junction diode.

Throughout the specification, expressions such as "the same" "corresponding", "constant" and "maintaining" are used on the assumption that there may be deviations within the scope of design at the time of embodying the techniques described in the embodiments. The same applies to the expressions accompanied with "substantially" such as "substantially the same". The expressions "supply a voltage" or "apply a voltage" are used with the intention of including both controlling the application or supply of the voltage, and actually applying or supplying the voltage. In addition, applying or supplying a voltage may include applying or supplying a voltage of 0 V.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device comprising:
an input terminal, an output terminal, and a first control terminal;
a first transistor and a second transistor serially coupled between the input terminal and the output terminal, wherein the first transistor includes a first end and a second end used for the serial coupling, a first gate coupled to the first control terminal, and a first body; the second transistor includes a third end and a fourth end used for the serial coupling, a second gate coupled to the first control terminal, and a second body; and the third end is coupled to the second end;
a first resistor coupled to the first end;
a second resistor coupled between the first resistor and the second end;
a third resistor coupled to the third end;
a fourth resistor coupled between the third resistor and the fourth end;
a first diode having an anode coupled to the first body and a cathode coupled to a node coupling the third resistor and the fourth resistor; and
a second diode having an anode coupled to the second body and a cathode coupled to a node coupling the first resistor and the second resistor.

2. The device of claim 1, wherein
the first resistor and the fourth resistor have an identical resistance value, and the second resistor and the third resistor have an identical resistance value.

3. The device of claim 1, wherein
a resistance value of the first resistor is one-third to three times larger than a resistance value of the second resistor, and a resistance value of the fourth resistor is one-third to three times larger than a resistance value of the third resistor.

4. The device of claim 2, wherein
a resistance value of the first resistor is one-third to three times larger than a resistance value of the second resistor, and a resistance value of the fourth resistor is one-third to three times larger than a resistance value of the third resistor.

5. The device of claim 1, further comprising:
a third transistor and a fourth transistor serially coupled to the first transistor and the second transistor between the input terminal and the output terminal, wherein the third transistor includes a fifth end and a sixth end used for the serial coupling, a third gate coupled to the first control terminal, and a third body; the fourth transistor includes a seventh end and an eighth end used for the serial coupling, a fourth gate coupled to the first control terminal, and a fourth body; the seventh end is coupled to the sixth end; and the eighth end is coupled to the first end;
a fifth resistor coupled to the fifth end;
a sixth resistor coupled between the fifth resistor and the sixth end;
a seventh resistor coupled to the seventh end;
an eighth resistor coupled between the seventh resistor and the eighth end;
a third diode having an anode coupled to the third body and a cathode coupled to a node coupling the seventh resistor and the eighth resistor; and
a fourth diode having an anode coupled to the fourth body and a cathode coupled to a node coupling the fifth resistor and the sixth resistor.

6. The device of claim 5, wherein
no diode is provided between the first body and the node coupling the seventh resistor and the eighth resistor, and
no diode is provided between the fourth body and the node coupling the first resistor and the second resistor.

7. The device of claim 1, further comprising:
one or more diodes coupled between the cathode of the first diode and the node coupling the third resistor and the fourth resistor; and
one or more diodes coupled between the cathode of the second diode and the node coupling the first resistor and the second resistor.

8. The device of claim 1, further comprising:
a fifth transistor serially coupled to the first transistor and the second transistor between the input terminal and the output terminal, the fifth transistor having a ninth end and a tenth end used for the serial coupling, a fifth gate coupled to the first control terminal, and a fifth body, and the ninth end being coupled to the fourth end;
a ninth resistor coupled to the ninth end;
a tenth resistor coupled between the ninth resistor and the tenth end; and
a fifth diode having an anode coupled to the fifth body and a cathode coupled to the node coupling the third resistor and the fourth resistor.

9. The device of claim 1, further comprising:
a sixth diode having an anode coupled to the first body and a cathode coupled to the first gate; and
a seventh diode having an anode coupled to the second body and a cathode coupled to the second gate.

10. The device of claim 1, further comprising:
a second control terminal coupled to the first body and the second body.

11. The device of claim 1, further comprising:
an eleventh resistor arranged between the first control terminal and the first gate; and
a twelfth resistor arranged between the first control terminal and the second gate.

12. The device of claim 10, further comprising:
a thirteenth resistor arranged between the second control terminal and the first body; and
a fourteenth resistor arranged between the second control terminal and the second body.

13. The device of claim 1, further comprising:
a sixth transistor serially coupled to the first transistor and the second transistor between the input terminal and the output terminal, the sixth transistor having an eleventh end and a twelfth end used for the serial coupling, a sixth gate coupled to the first control terminal, and a sixth body, the twelfth end being coupled to the first end;
a fifteenth resistor coupled to the eleventh end;
a sixteenth resistor coupled between the fifteenth resistor and the twelfth end; and
an eighth diode having an anode coupled to the sixth body and a cathode coupled to the node coupling the first resistor and the second resistor.

14. The device of claim 1, wherein
the first transistor and the second transistor are provided on an SOI substrate.

15. The device of claim 1, wherein
a high-frequency signal is input to the input terminal.

* * * * *